United States Patent [19]

Desormieŕe et al.

[11] 4,041,419

[45] Aug. 9, 1977

[54] SURFACE ELASTIC WAVE ANALOGUE CORRELATOR

[75] Inventors: Bernard Desormieŕe; Olivier Menager; Albert Courty; Grégoire Eumurian, all of Paris, France

[73] Assignee: Thomson-CSF, Paris, France

[21] Appl. No.: 593,245

[22] Filed: July 7, 1975

[30] Foreign Application Priority Data

July 9, 1974 France ............................... 74.23837

[51] Int. Cl.[2] ......................... H03H 9/26; H03H 9/30; H01L 27/20; G06G 7/18

[52] U.S. Cl. .................................. 333/30 R; 235/181; 310/313; 333/70 T; 333/72; 357/26

[58] Field of Search ..................... 333/72, 30 R, 70 T; 235/181, 194; 310/8, 8.1, 8.2, 9.8; 330/5.5; 357/26

[56] References Cited

U.S. PATENT DOCUMENTS

| | | | |
|---|---|---|---|
| 3,760,172 | 9/1973 | Quate | 235/181 |
| 3,770,949 | 11/1973 | Whitehouse et al. | 235/181 |
| 3,816,753 | 6/1974 | Kino | 235/181 X |
| 3,826,932 | 7/1974 | Wang | 310/8.1 |
| 3,833,867 | 9/1974 | Solie | 333/30 R |
| 3,851,280 | 11/1974 | Staples | 333/30 R |
| 3,931,509 | 1/1976 | Otto | 333/72 X |

*Primary Examiner*—Alfred E. Smith
*Assistant Examiner*—Marvin Nussbaum
*Attorney, Agent, or Firm*—Cushman, Darby & Cushman

[57] ABSTRACT

The correlator comprises a piezo-electric substrate on the ends of which there are arranged two transducers supplied with two electrical signals and emitting two contra-propagating surface waves. The correlator furthermore comprises *m* processing channels supplied with electrical signals induced by the surface waves at *m* "points" on the substrate which are distributed in the direction of propagation of the waves. Each channel comprises a non-linear device and an integrator furnishing a sample of the correlation function of the two signals.

6 Claims, 5 Drawing Figures

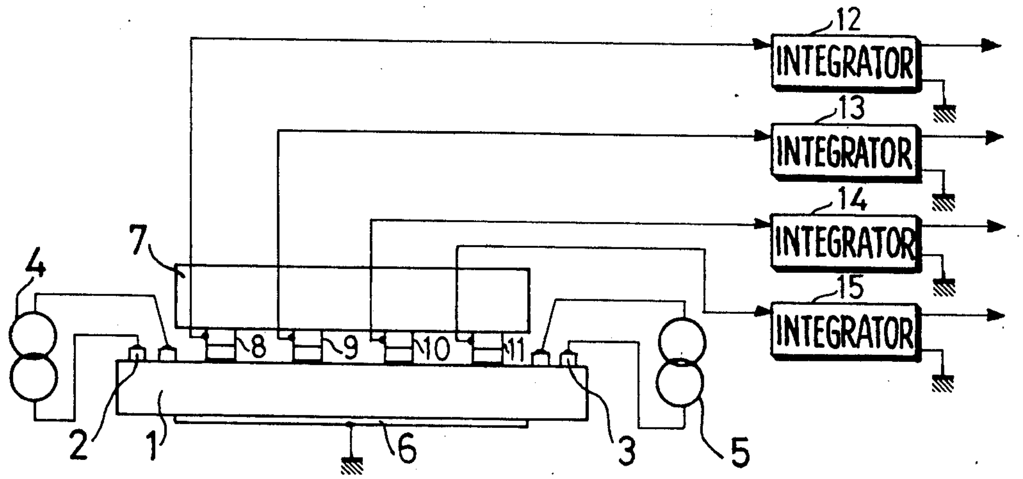
FIG. 1
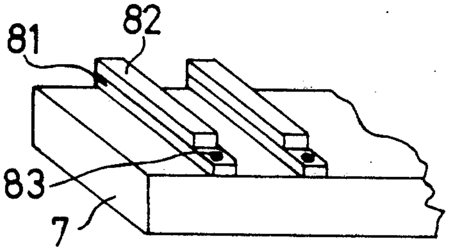
FIG. 2
FIG. 3
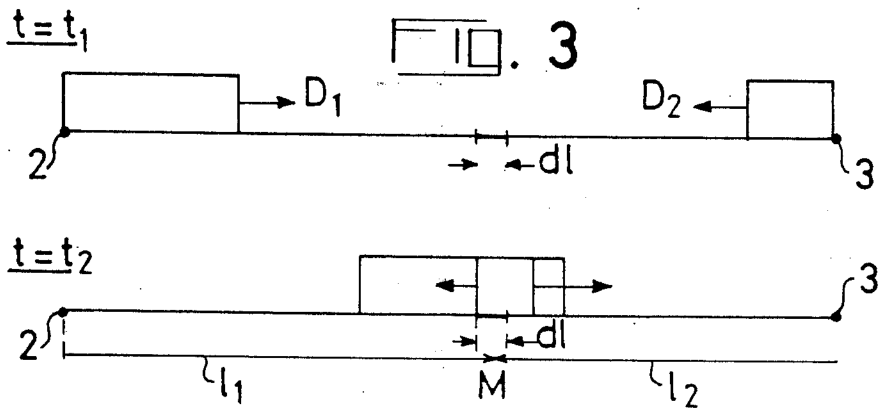

SURFACE ELASTIC WAVE ANALOGUE CORRELATOR

The present invention relates to the field of devices for correlating two electrical signals and relates more particularly to a correlator into which the delay introduced for one of the two signals (or the delays introduced for both of them) in order to obtain a correlation product, is produced by means of a surface elastic wave delay device.

Surface elastic wave devices which make it possible to obtain the correlation product of two signals, from their convolution product are known: the electrical signals are used to excite two input transducers arranged at the two ends of a piezo-electric substrate, thus creating two surface waves at the surface of said substrate, which propagate in opposite directions. Because of the inherent non-linearities of the propogation medium, or the non-linearities generated in a semi-conductive medium, at any point on the surface, a signal representing the product of the two elementary signals induced by said surface waves, appears.

This signal is picked off over an extended interaction zone greater than or equal to the spatial extent of the surface wave associated with the longest signal.

To obtain the correlation product of the two electrical signals, it is then necessary to perform a time reversal operation on one of the two signals. The devices which enable this reversal to be performed, are complex and introduce very substantial losses so that the resultant signals have highly attenuated amplitudes.

The object of the present invention is an analogue correlator of surface wave kind, which is simpler and more efficient, utilises a delay line and has the advantage of providing direct sampling of the correlation function of two electrical signals, that is to say the correlation products of the two signals at different points on the delay line (without any limitation as to the duration of the two signals).

According to the invention, there is provided a surface elastic wave analogue correlator having a first and a second input designed to be respectively supplied with a first and a second signal and $m$ outputs each designed to deliver one of $m$ samples of the correlation function of said first and second signals ($m$ being a positive whole number), comprising:

- a surface elastic wave delay device comprising a piezoelectric substrate and a first electromechanical transducer located on a propagating surface on said substrate connected to said first input and adapted for emitting a first surface wave propagating on said substrate and $m$ surface wave sensing areas positioned for receiving said surface wave;
- and $m$ analogue processing channels having respective inputs arranged at said $m$ sensing areas, each comprising a non linear transmission device having a first input coupled to the input of said channel, a second input coupled to said second input of said correlator and an output, each channel further comprising integrator means having an input coupled to said output of said transmission device and an output forming one said $m$ outputs of the correlator.

The invention will be better understood and other of its features rendered apparent from a consideration of the ensuing description in accordance with the attached figures where:

FIGS. 1, 4 and 5 illustrate embodiments of the analogue correlator in accordance with the invention;

FIG. 2 illustrates a detailed view of one of the elements of the analogue correlator shown in FIG. 1;

FIG. 3 is an explanatory diagram illustrating the operation of the correlator in accordance with the invention.

Figure 4:
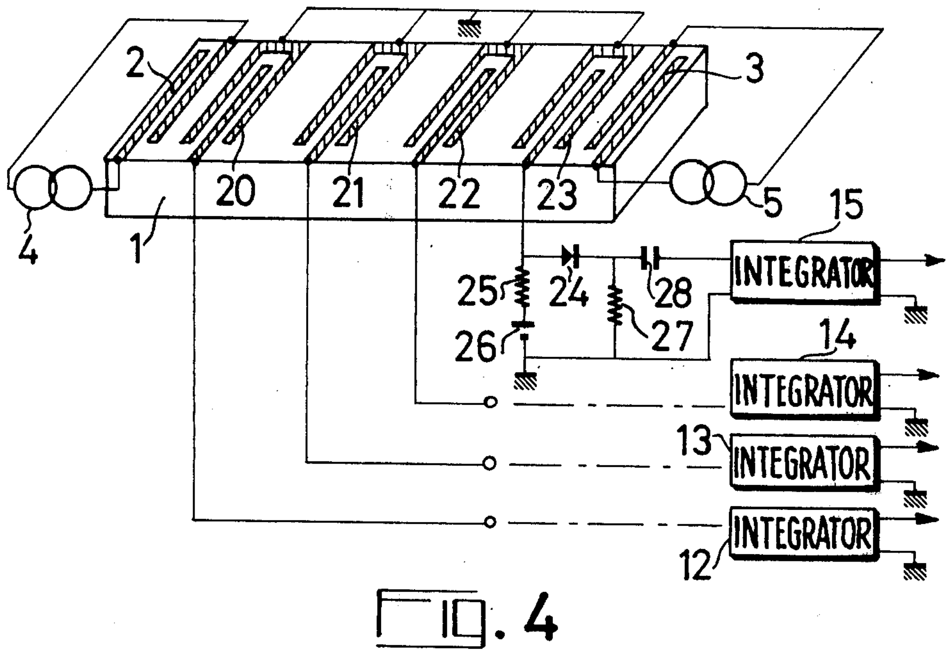

It will be remembered that the correlation function C ($\tau$) of two signals $f(t)$ and $g(t)$ takes the form:

$$C(\tau) = \int_{-\infty}^{+\infty} f(t)\, g(t+\tau)\, dt = \int_{-\infty}^{+\infty} f(t-\tau)\, g(t) dt.$$

Thus, if a wave is propagating through a delay line and arrives at a point $M$ therein after a delay $T_1$ and if it is possible at said point $M$ to multiply the delayed signal induced by said wave by a second signal, an elementary product of the two signals at the point $M$ $f(t - T_1)\, g(t)$ is obtained.

By integrating this signal in accordance with time, over the duration of the longest signal, the signal picked off at the output of the integrator is substantially equal to:

$$\int_{-\infty}^{+\infty} f(t - T_1) g(t) dt$$

this in fact being the value of the correlation product at the abscissa point $\tau = T_1$, that is to say the ordinate point corresponding to the correlation function.

Similarly, if two contra-propagating waves characterictic of functions $f(t)$ and $g(t)$ propagate along the delay line and arrive at a point M with respective delays of $T_1$ and $T_2$, and if at said point M means are arranged in order to form the product of the two waves or the product of the two signals induced by said waves, then an elementary product $f(t - T_1)\, f(t - T_2)$ is obtained which, integrated with respect to time over the duration of the longest signal, substantially gives:

$$\int_{-\infty}^{+\infty} f(t - T_1)\, g(t - T_2)\, dt, \text{ or with } T = T_1 + T_2:$$

$$\int_{-\infty}^{+\infty} f\left[u - 2\left(T_1 - \frac{T}{2}\right)\right] g(u)\, du, \text{ that is to say the}$$

correlation product at the abscissa point $\tau = 2\,(T_1 - T/2)$.

By multiplying the number of sampling points, thus in accordance with the foregoing considerations, a discrete set of samples of the correlation function of the two signals is obtained.

These observations are employed in the correlators in accordance with the invention. The delay lines utilised in these correlators are surface elastic wave delay essentially constituted by a piezo-electric substrate. The surface wave is emitted at the input of the line by an electromechanical transducer converting electrical energy applied to its terminals, into mechanical energy in the form of vibrations at the same frequency.

An output transducer arranged on the line at the desired pick-up point, effects the reverse conversion operation and regenerates an electrical signal similar to the input signal but having a delay proportional to the propagation distance.

Because of the low speed of the waves through solids, the number of phase rotations per unit length of the acoustic waveguide is very large (the wavelength of the emitted signals being short). Delay lines of this kind therefore introduce substantial delays for a relatively small bulk. This advantage is exploited in the correlators described.

The simplest correlator in accordance with the invention would be a correlator utilising the inherent non-linearities of the propagation medium. In other words, with the piezo-electric substrate operating in the saturation state a non-linear effect develops between the two waves. Direct picking off of the signals thus obtained leads, however, to the production of low-amplitude signals.

Preferably, a non-linearity obtained by means of semiconductor elements applied to the surface of the piezo-electric substrate, or by means of external diodes, will be utilised.

In FIG. 1, a piezo-electric substrate 1 (for example of lithium niobate) has been shown at the ends of the top surface of which there are attached two electromechanical comb shaped transducers 2 and 3 with interdigital electrodes. The two electrodes of the transducer 2 are connected to the output terminals of a current generator 4 and the electrodes of the transducer 3 are connected to the output terminals of a current generator 5. The transducers 2 and 3 are of the kind which convert the currents applied to them into distortions respectively creating at the top surface of the piezo-electric substrate, first and second surface elastic waves propagating in opposite directions.

An electrode 6, connected to ground, is attached to that surface of the piezo-electric substrate opposite to the one which is employed to propagate the surface elastic waves.

The correlator furthermore comprises transmission and analogue processing channels. In order to simplify the figure, only four of these channels have been shown. Each comprises a semi-conductive junction attached to an insulating substate 7 and followed by an integrator.

Four bands of semi-conductive material 8, 9, 10 and 11 (made for example of silicon) are attached to the substrate 7 perpendicularly to the direction of wave propagation. The insulating substrate and the bands of semi-conductive material have been shown in FIG. 2. Each band is formed by $n+$-doped layer 81 in contact with the insulator and an n-doped layer 82 arranged on top of the piezo-electric substrate. A tablet 83 enabling a conductor wire to be soldered in position, is deposited upon the $n+$-doped layer 81.

These layers can be produced by forming a semi-conductor deposit on an insulating substrate, this semi-conductor deposit comprising two successive $n+$-doped and n-doped layers. The deposit is then chemically etched out down to the insulating substrate in order to form the semi-conductive elements described hereinbefore.

The conductor wires attached to the $n+$-doped layers of the four bands 8, 9, 10 and 11 are respectively connected to the first input terminals of four integrators 12, 13, 14 and 15, the other input terminal of each of these circuits being connected to ground. The outputs of the integrators constitute the outputs of the correlator each integrator producing a sample of the correlation function of the two input signals supplied by the current generators 4 and 5.

The correlator operates in the following way: The two waves emitted by the transducers 2 and 3 propagate parallel to the major dimension of the piezo-electric substrate. An elementary area dS of length dl (the width of the substate being taken as unity) behaves in association with the semi-conductor band applied to said area dS, a voltage being picked off between the co-operating electrode 6 and the $n+$-doped layer of the semi-conductive element. A diagram explaining the operation of the correlator has been shown in FIG. 3. The transducers 2 and 3 emit surface waves respectively in the directions $D_1$ and $D_2$. At the instant $t = t_1$, the two waves have not yet reached the pick-off of length dl, which is at a distance $l_1$ from the transducer 2 and at a distance $l_2$ from the transducer 3.

At the instant $t = t_2$, the two waves are simultaneously present at the point M. These two waves induce in the semi-conductor applied to said area dS of length $dl$ an elementary voltage $e$:

$$e = \int_{t_2 - \Delta t}^{t_2 + \Delta t} f(t - T_1)\, g(t - T_2)dt$$

where 2 $\Delta t$ is the propagation time of the waves over the elementary length $d$l.

Provided that the product of the two functions varies little over said interval, said elementary voltage is proportional to $f(t-T_1)\ g(t-T_2)$ and corresponds to the product of the two functions at the center of the interval dl.

The output voltage of the integrator represents the correlation product of the two functions at the point $\tau = 2\ (T_1 - T_2)$.

FIG. 4 illustrates a second embodiment of a correlator in accordance with the invention.

A certain number of elements identical to those of the correlator shown in FIG. 1 have been illustrated there with the same references: the piezo-electric substrate 1, with its two input transducers 2 and 3 respectively supplied by the current generators 4 and 5, and the output integrators 12, 13, 14 and 15. Four analogue processing channels have been shown. They each comprise an output transducer, respectively 20, 21, 22 and 23. The first electrodes of each of the output transducers are connected to ground. The other elements of the different channels have been shown in the figure exclusively for the channel corresponding to the transducer 23. The other channels, identical to that described, have not been shown.

The second electrode of the transducer 23 is connected to the anode of a diode 24. The anode of this diode is biased by a direct voltage source 26 across a resistor 25. The voltage source 26 is on the other hand connected to ground. The cathode of the diode 24 is connected both a resistor 27 which is in turn grounded and to a capacitor 28 connected in its turn to the input of the integrator 15, the other input terminal of the integrator being grounded. The output terminals of the integrator constitute the output of the corresponding channel.

The transducers 20, 21, 22 and 23 are interdigital comb structures. The distance separating two adjacent teeth of a comb, that is to say separating an arm of one electrode of the transducer from the adjacent arm of the other electrode, is equal to $\lambda/2$, $\lambda$ being the wavelength corresponding to the carrier frequency of the input signals if these are modulating a carrier wave, or to their mean frequency if they are directly applied to the transducers which emit the surface waves.

The distance $\lambda/2$ between the teeth of the two electrodes of the comb structure is the optimum distance for the picking up of the maximum signal induced by a wave of frequency $c/\lambda$ without picking up the parasitic signals which are due to non-linearities inherent in the propagation medium. In effect, parasitic waves propagating at a frequency twice that of the initial waves do not induce any additional electromotive force by integration over $\lambda/2$. Between the two electrodes of the transducer, and leaving apart the non-linearity of the substrate, an electrical signal is picked off which is equal to the sum of the signals induced by the two waves. If the wave emitted by the transducer 2 arrives at an output transducer, 23 for example, with a delay $T_1$ and if the wave emitted by the transducer 3 arrives at the same output transducer 23 with a delay of $T_2$, then the voltage picked off across the terminals of this output transducer, at an instant $t$ will be given by: $v = K[f(t-T_1) + g(t-T_2)]$ where $K$ is a constant.

The alternating current $i$ which flows through the diode, biased to give a square-law characteristic is $i = kv^2$, $k$ being a constant.

Thus, at the input of the integrator a current $i$ proportional to:

$$f(t-T_1)^2 + g(t-T_2)^2 + 2f(t-T_1)\,g(t-T_2)$$

is obtained.

It is only the last term in this sum which is of interest when the production of the correlation product is concerned.

The integration of this signal in respect of time gives a value proportional to the correlation product of the two signals $f(t)$ and $g(t)$ at the point $\tau = 2(T_1 - T/2)$, increased by a value equal to $$\int_{-\infty}^{+\infty} \left[ f(t-T_1)^2 + g(t-T_2)^2 \right] dt$$

This value is constant whatever the pick-off point.

In certain applications, it is only the shape of the correlation function which is used. Detection using a diode which results in the production of a direct component, is tantamount to shifting the ordinate axis of the correlation function and this does not introduce any drawback. It is possible, however, to suppress this direct component by means of a simple device, the functions $f(t)$ and $g(t)$ being detected separately by means of two supplementary diodes each followed by an integrator and the sum of the signals thus obtained being subtracted from the signal appearing at the output of the integrator.

A variant of the embodiment shown in FIG. 4 consists in applying the second signal directly to the diodes of the different channels. To do this, the second input transducer 3 is off and the second signal is applied directly by a voltage generator between ground and a terminal common to the receive transducers 20, 21, 22 and 23.

In all the preceding cases, the output signals from the channels are samples of the correlation function $C(\tau)$ of the two signals or of a function directly associated with the correlation function, for points $\tau$ comprised between $-T$ and $+T$ that is to say within a window of width 2T, this except in the variant embodiment of FIG. 4 in which only one of the two signals is delayed where the window has a length of T. It is possible to enlarge this measurement window. In effect, although it is substantial, the delay introduced into a signal by an acoustic delay line is a function of the line length. A first solution would therefore be to lengthen the delay line and to arrange along the line a larger number of transducers in order to scan within a larger window of the correlation function.

Another solution would be to lengthen the line by arranging at suitable intervals along same, input transducers successively receiving successive sections of one of the two signals, $f(t)$ for example.

Figure 5:
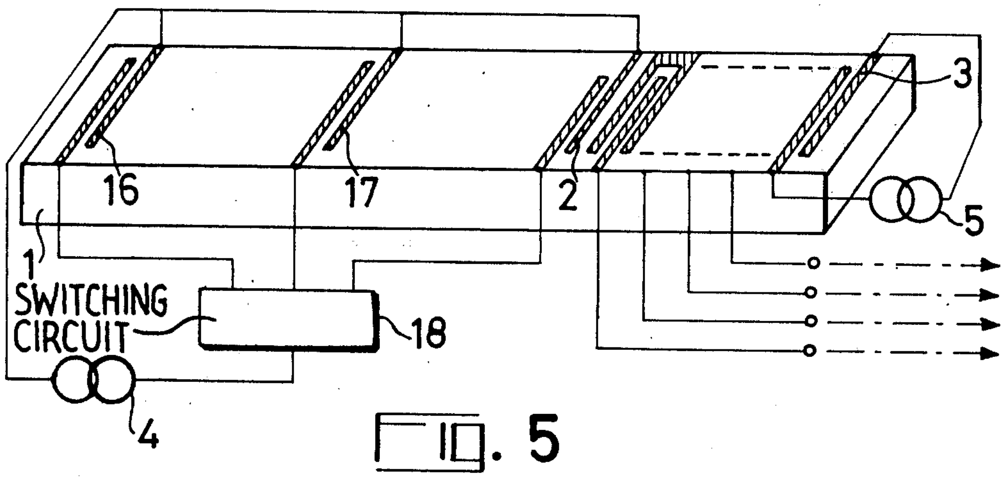

This is the object of the correlator embodiment of the invention, as illustrated in FIG. 5.

There, at the right hand side of the figure, the same elements as shown in FIG. 4 are to be seen. The output channels, similar to those of FIG. 4, have not been shown. The piezo-electric substate has been assumed to be three times longer than that of FIG. 4. The transducer 2 is arranged at ⅔ along the length of the delay line. Two emission transducers 16 and 17 are disposed respectively at the end and a third of the way along the piezo-electric substrate. The current generator 4 is connected by one of its terminals to the first electrodes of the transducers 2, 16, and 17, its other terminal being connected to a three-output switching circuit 18, the outputs of which are connected to the second electrodes of the transducers 2, 16 and 17. This switching circuit 18 incorporates a clock and makes it possible to successively supply the transducers 2, 16 and 17. The discharge of the output integrators of the different channels is controlled in the rhythm of switching of the transducers 2, 16 and 17.

Thus, series of samples of the correlation function are obtained, successively between $-T$ and $+T$ when the transducer 2 is supplied, between T and 3T when the transducer 17 is supplied and between 3T and 5T when the transducer 16 is supplied. The number of transducers is not limited to 3.

Another solution, commencing from the device shown in FIG. 4, is to successively supply the transducer 2 with $f(t)$, $f(t)$ delayed by $T$, $f(t)$ delayed by 2T, etc.

For each period of operation of the transducer 2, a set of samples of the correlation function appears at the outputs of the integrators in the different processing channels. It is thus possible to arbitrarily multiply the range of the scanning zone within which the correlation function is scanned, by means of associated delay lines for example.

The invention is not limited to the embodiments described. In particular, associated delay lines can be added to the devices described by means of FIGS. 1 and 4.

Other transducers could equally be arranged on a longer piezo-electric substrate. It is also possible to delay the two input signals simultaneously by means of delay lines or by arranging along the substrate, several suitably distributed transducers, disposed at the surface of the substrate, being supplied with $f(t)$ and par $g(t)$. Moreover, the number of pick-up points is only limited by the length of the substrate and the length of the pick-up points themselves In practice, for lengths $dl$ varying between 1 mm and 10 $\mu$m and a propagation length of 25 mm, the number of pick-up points can vary between 25 and 2500.

What we claim is:

1. A surface elastic wave analogue correlator having a first and a second input designed to be respectively supplied with a first and a second signal and *m* outputs each designed to deliver one of *m* samples of the correlation function of said first and second signals, *m* being a positive whole number, comprising:

a surface elastic wave delay device comprising a piezo-electric substrate, an electro-mechanical transducer located on a propagating surface on said substrate connected to said first input and adapted for emitting a surface wave propagating on said substrate and *m* surface wave sensing areas positioned for receiving said surface wave; and

*m* analogue processing channels, said *m* analogue processing channels having respective input means arranged at said *m* sensing areas, each of said channels comprising a non-linear transmission device having a first input connected to the input of said channel, a second input connected to said second input of said correlator and an output, each channel further comprising integrator means having an input connected to the said output of said transmission device and an output forming one said *m* output of the correlator.

2. A surface elastic wave analogue correlator having first and second inputs designed to be respectively supplied with first and second signal and *m* outputs, each designed to deliver one of *m* samples of the correlation function of said first and second signals, *m* being a positive whole number, comprising:

a surface elastic wave delay device having a piezo-electric substrate and first and second electromechanical transducers located on a propagating surface on said substrate respectively connected to said first and second inputs of said correlator and adapted for respectively emitting first and second surface waves contra-propagating on said substrate along a propagation axis, and *m* surface wave sensing areas positioned along said propagation axis for receiving said first and second surface waves; and

*m* analogue processing channels, said *m* analogue processing channels having respective input means arranged at said *m* sensing areas, each of said channels comprising a non-linear transmission device having an input coupled to the input means of said channel and an output, each channel further comprising integrator means having an input connected to the said output of said transmission device and an output forming one of said outputs of said correlator.

3. A surface elastic wave analogue correlator as claimed in claim 2, wherein each of said non-linear transmission devices is constituted by a semiconductor junction, said junctions being obtained by depositing on an insulating substrate a semiconductor $n^+$ - doped layer and a semiconductor n-doped layer in which parallel slots are hollowed out down to said insulating substrate in order to form an array of *m* junctions, each having a face adjacent the propagating surface of said first and second surface waves at said sensing areas and wherein an electrode is located close to the surface of said piezo-electtric substrate opposite to said propagating surface, said adjacent surface of one of said junction and said electrode forming said input of a channel.

4. A surface elastic wave analogue correlator as claimed in claim 2, wherein said input means of said channels are pick-ups having two interdigited electrodes arranged at said sensing areas.

5. An analogue correlator as claimed in claim 2, wherein said first signal is delayed by T, 2T . . . *n*T, by means of associated delay devices, said first transducer successively receiving said first signal with no delay, with a delay of T, with a delay of 2T . . . with a delay of *n*T, T being the propagation time of said first surface wave along said surface elastic wave delay device.

6. An analogue correlator as claimed in claim 5, wherein said second signal is likewise delayed by T, 2T, . . . *n*T by means of associated delay devices.

* * * * *